United States Patent [19]
Hiroki et al.

[11] Patent Number: 5,218,464
[45] Date of Patent: Jun. 8, 1993

[54] ELECTRO-OPTICAL DEVICE

[75] Inventors: Masaaki Hiroki, Kanagawa; Shunpei Yamazaki, Tokyo, both of Japan

[73] Assignee: Semiconductor Energy Laboratory Co., Ltd., Kanagawa, Japan

[21] Appl. No.: 836,797

[22] Filed: Feb. 18, 1992

[30] Foreign Application Priority Data

Feb. 16, 1991 [JP] Japan .................................. 3-077318

[51] Int. Cl.[5] .......................... G02F 1/13; G09G 3/02
[52] U.S. Cl. ........................................ 359/59; 359/54; 340/719
[58] Field of Search ..................... 359/59, 54; 340/784, 340/719; 257/104, 190, 288, 297

[56] References Cited
U.S. PATENT DOCUMENTS 5,132,677  7/1992  Nicholas .............................. 359/59

FOREIGN PATENT DOCUMENTS 0144297 12/1978 Japan .................................. 340/784

Primary Examiner—William L. Sikes
Assistant Examiner—Huy K. Mai
Attorney, Agent, or Firm—Sixbey, Friedman, Leedom & Ferguson

[57] ABSTRACT

An electro-optical device having plural picture elements arranged in a matrix form, including thin film transistor assemblies each including a complementary thin film transistor which is connected to each picture element and comprises P-channel thin film transistor and N-channel thin film transistor, and P-channel and N-channel thin film transistors for driving the complementary thin film transistor. One signal line used for driving one thin film transistor of the thin film transistor assembly for a picture element is commonly used for driving one thin film transistor of another thin film transistor assembly for another picture element adjacent to the picture element.

20 Claims, 9 Drawing Sheets

ELECTRO-OPTICAL DEVICE

BACKGROUND OF THE INVENTION

1. FIELD OF THE INVENTION

This invention relates to an active type electro-optical device, particularly an active type liquid crystal device, and more particularly to a display device in which two thin-film type insulated gate field effect transistors (hereinafter referred to as "TFT") of P-channel and N-channel types are complementarily provided to each picture element to thereby form pixels on a screen of the device.

2. DESCRIPTION OF THE PRIOR ART

An active type of liquid crystal device using TFTs has been conventionally known as an effective display device. In this type of the display device, the TFT is formed of semiconductor of amorphous or polycrystal structure, and each picture element of the device is equipped with only one of two conducting types (P-channel and N-channel types) of TFTs. In general, an N-channel type of TFT (hereinafter referred to as "NTFT") is connected to each picture element in series, as representatively shown in FIG. 6.

Figure 6:
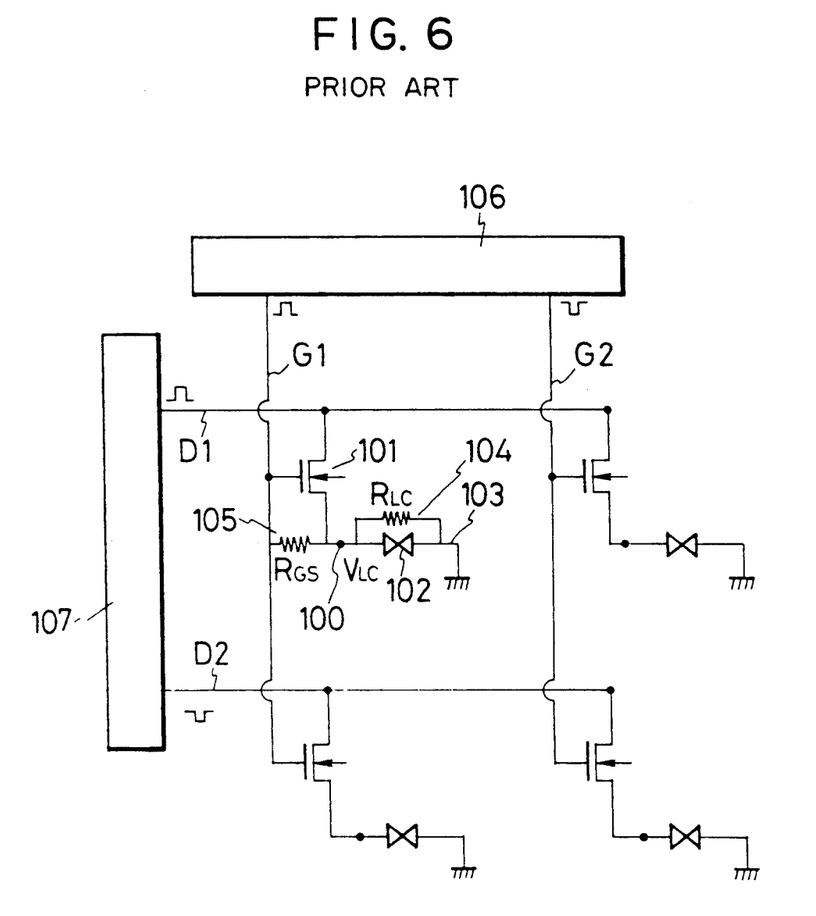
FIG. 6 is a circuit diagram of a conventional display device.

The active matrix type of liquid crystal display device as described above generally has many picture elements, for example, 480×640 or 1260×960 picture elements. FIG. 6 shows an example of the active matrix type of liquid crystal display device as described above, where a 2×2 matrix arrangement is illustrated in order to simplify the description thereof. In this matrix arrangement, plural gate lines $G_1$ and $G_2$ and plural signal lines $D_1$ and $D_2$ are arranged in Y-axial and X-axial directions respectively so as to be intersected to each other, and a displaying element for a picture element is provided at each intersecting point. Each displaying element for the picture element comprises a liquid crystal portion 102 and TFT portion 101. Each picture element is supplied with signals from peripheral circuits 106 and 107 to selectively switch desired picture elements between on and off states for a displaying operation.

In a displaying operation of the liquid crystal display device which has been actually manufactured, there frequently occurs a case where an output voltage of the TFT, that is, an input voltage 100 ($V_{LC}$) to the liquid crystal portion 102 (hereinafter referred to as "liquid crystal potential") is not set to "1" (high state) when it must be set to "1", and also is not set to "0" (low state) when it must be set to "0". This unfavorable phenomenon is caused by an asymmetric electric characteristic of a switching element (that is, TFT) for supplying a signal to the picture element. That is, the TFT has an asymmetric electrical characteristic between charging and discharging actions thereof to and from a picture element electrode which corresponds to one electrode of the liquid crystal portion 102. The liquid crystal has originally an insulating property in its action, and thus the liquid crystal potential $V_{LC}$ is left floated (undischarged) during the Off-state of the TFT. The liquid crystal portion 102 equivalently corresponds to a capacitor, and thus the liquid crystal voltage $V_{LC}$ is determined by charges accumulated in the liquid crystal portion 102. The charges accumulated in the liquid crystal portion 102 is liable to leak therefrom in a case where the resistance of the liquid crystal portion 102 is reduced to a relatively small value due to $R_{LC}$ or where dust or ionic impurities exist in the liquid crystal portion 102, or liable to leak from pinholes which have been formed in a gate insulating layer of the TFT, so that the liquid crystal potential $V_{LC}$ is unstably varied and thus is set to an incomplete value. Therefore, for the liquid crystal display device having a large number of picture elements of 200,000 to 5,000,000, high yield can not be obtained.

In addition, the leaking of charges accumulated in the liquid crystal portion 102 is also caused between neighboring picture elements due to the following rubbing process. That is, a TN (twisted nematic) liquid crystal is generally used as the liquid crystal portion 102. In order to orient liquid crystal molecules to a predetermined direction, both electrodes of the liquid crystal portion 102 for driving the liquid crystal are provided with orienting films which have been subjected to a rubbing process. The liquid crystal portion 102 is weakly broken down by static electricity which has generated in the rubbing process, so that the charges accumulated in the liquid crystal portion 102 are liable to leak between neighboring picture elements or between neighboring conducting leads through the broken-down portion, or leak through a damaged gate insulating layer.

In the active type liquid crystal device as described above, it is very important to keep the liquid crystal potential $V_{LC}$ to a predetermined level (the same as an initial level) at all times during one-frame displaying operation. However, an actually-manufactured display device has some malfunctioning active elements, so that the liquid crystal level can not be actually kept to the initial level during one-frame displaying operation.

Figure 7:
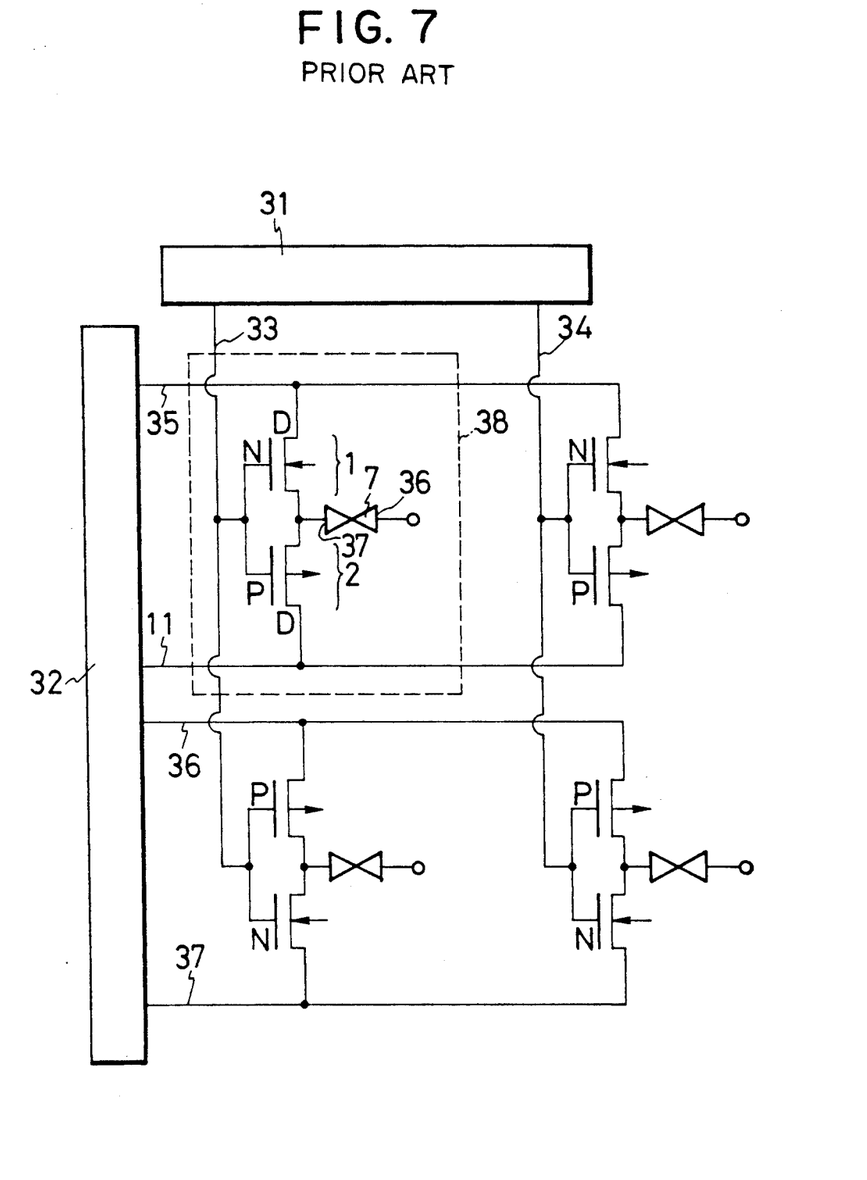
FIG. 7 is another circuit diagram of a conventional display device.

In order to overcome the above disadvantage, there has been proposed a display device as shown in FIG. 7 in which each picture element is provided with a matrix wiring comprising a pair of first and second signal lines in the X-axial direction and a third signal line in the Y-direction, and a complementary thin film transistor and a picture element electrode are provided at an intersecting portion of these signal lines. In the display device thus constructed, as shown in FIG. 7, the source portions of a P-channel thin film transistor 2 and an N-channel thin film transistor 1 are commonly connected to a picture element electrode, and the drain of the N-channel thin film transistor 1 is connected to the first signal line 35 of the paired signal lines in the X-direction while the drain portion of the P-channel thin film transistor 2 is connected to the second line 11. On the other hand, gate portions of the respective P-channel and N-channel thin film transistors are commonly connected to the third signal line 33.

According to the display device as shown in FIG. 7, the foregoing disadvantage can be overcome, and a current margin is more increased, that is, a response speed is more increased. In addition, the potential of picture element at each pixel, that is, the liquid crystal potential $V_{LC}$ is sufficiently stably set to "1" or "0", and thus the level of the voltage $V_{LC}$ is prevented from drifting during one-frame displaying operation.

However, the display device as described above has a circuit construction that three signal lines are required for each picture element, and such a large number of signal lines causes reduction of an aperture ratio for determining display quality of the display device. This is a critical problem to the display device.

SUMMARY OF THE INVENTION

An object of this invention is to provide an electro-optical device having an improved aperture ratio in which the liquid crystal potential can be stably set to high and low states to thereby perform a stably displaying operation.

In order to attain the above object, according to this invention, an electro-optical device comprises:
- a pair of substrates;
- an electro-optical modulating layer provided between said substrates;
- a column control line provided on one of said substrates;
- two row control lines $R_1$ and $R_2$ provided on said one of said substrates;
- an electrode provided on said one of said substrates between said two row control lines;
- a first p-channel transistor $P_1$ and a first n-channel transistor $N_1$ which are provided on said one of said substrates and connected to said column control line at gate terminals of the transistors $P_1$ and $N_1$, and to said electrode at one of source and drain terminals of said first p-channel transistor $P_1$ and at one of source and drain terminals of said first n-channel transistor $N_1$;
- a second p-channel transistor $P_2$ provided on said one of said substrates and connected to the row control line $R_1$ at one of source and drain terminals of the transistor $P_2$, to the row control line $R_2$ at a gate terminal of the transistor $P_2$, and to the other one of the source and drain terminals of said first n-channel transistor $N_1$ at the other one of the source and drain terminals of said second p-channel transistor $P_2$; and
- a second n-channel transistor $N_2$ provided on said one of said substrates and connected to the row control line $R_2$ at one of source and drain terminals of the transistor $N_2$, to the row control line $R_1$ at a gate terminal of the transistor $N_2$, and to the other one of the source and drain terminals of said first p-channel transistor $P_1$ at the other one of the source and drain terminals of said second n-channel transistor $N_2$.

An electro-optical device having plural pixels (picture elements) arranged in a matrix form is characterized in that one of input and output terminals of a complementary thin film type transistor having a complementary structure of a first N-channel thin film transistor and a first P-channel thin film transistor is commonly connected to each pixel electrode (picture element electrode) on a substrate while the other is connected to respective ones of input and output terminals of second P-channel and N-channel thin film transistors, the other of the input and output terminal of the second P-channel thin film transistor is connected to a first signal line in an X-axial direction on the substrate while the other of the input and output terminal of the second N-channel thin film transistor is connected to a second signal line in the X-axial direction, gate electrodes of the first P-channel and first N-channel thin film transistors are commonly connected to a third signal line in a Y-axial direction on the substrate, a gate electrode of the second P-channel thin film transistor is connected to the second signal line, and a gate electrode of the second N-channel thin film transistor is connected to the first signal line, the second signal line for the pixel electrode (picture element electrode) serving as a first signal line of plural thin film transistors which are connected to the same third signal line and to another pixel electrode (picture element electrode) adjacent to the pixel electrode (picture element electrode) with the second signal line therebetween.

That is, the complementary thin film transistor circuit according to this invention includes an assembly of a complementary transistor of N-channel and P-channel thin film transistors which are commonly connected to display means and serve to controlling the potential of a pixel electrode (picture element electrode) of the display means, and P-channel and N-channel thin film transistors for controlling actuation of the complementary transistor, each assembly being assigned to each pixel (picture element).

According to the electro-optical device thus constructed, a signal line in the X-axial direction is commonly used between the neighboring thin film transistor assemblies of neighboring pixels (picture elements) through the signal line, so that only two signal lines are sufficient to drive one picture element (per picture element), and thus aperture ratio can be improved.

In an electro-optical device to which this invention is applicable, two or more thin film transistor assemblies may be connected to each picture element to form a pixel. Further, one pixel may be divided into two or more parts to which one or more thin film transistor assemblies are connected.

BRIEF DESCRIPTION OF THE DRAWINGS

FIGS. 3(A–F) are an example of a process for manufacturing the electro-optical device according to this invention;

DETAILED DESCRIPTION OF THE INVENTION

Preferred embodiments of this invention will be described hereunder with reference to the accompanying drawings.

Figure 1:
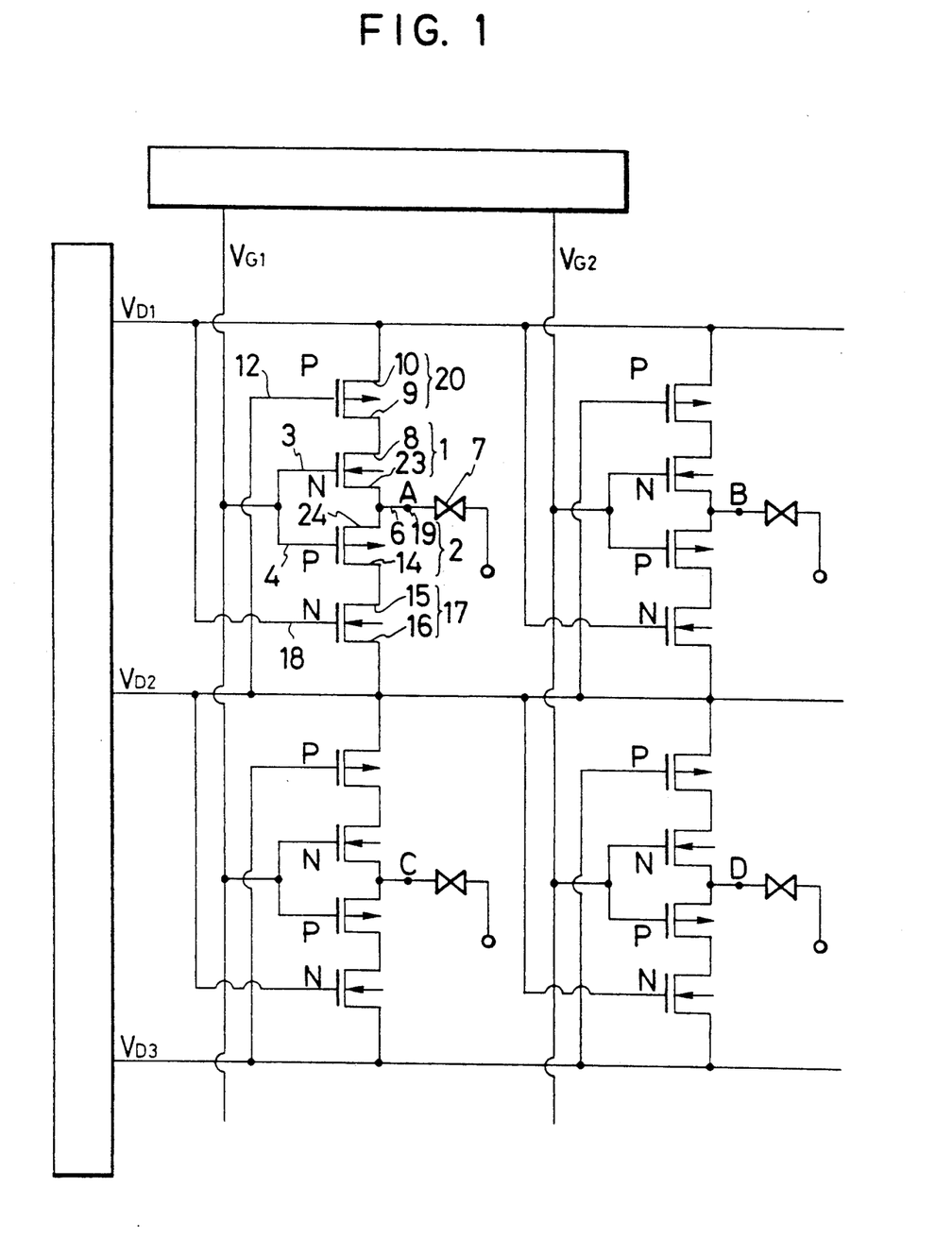
FIG. 1 is a circuit diagram of an electro-optical device according to this invention.
Figure 5:
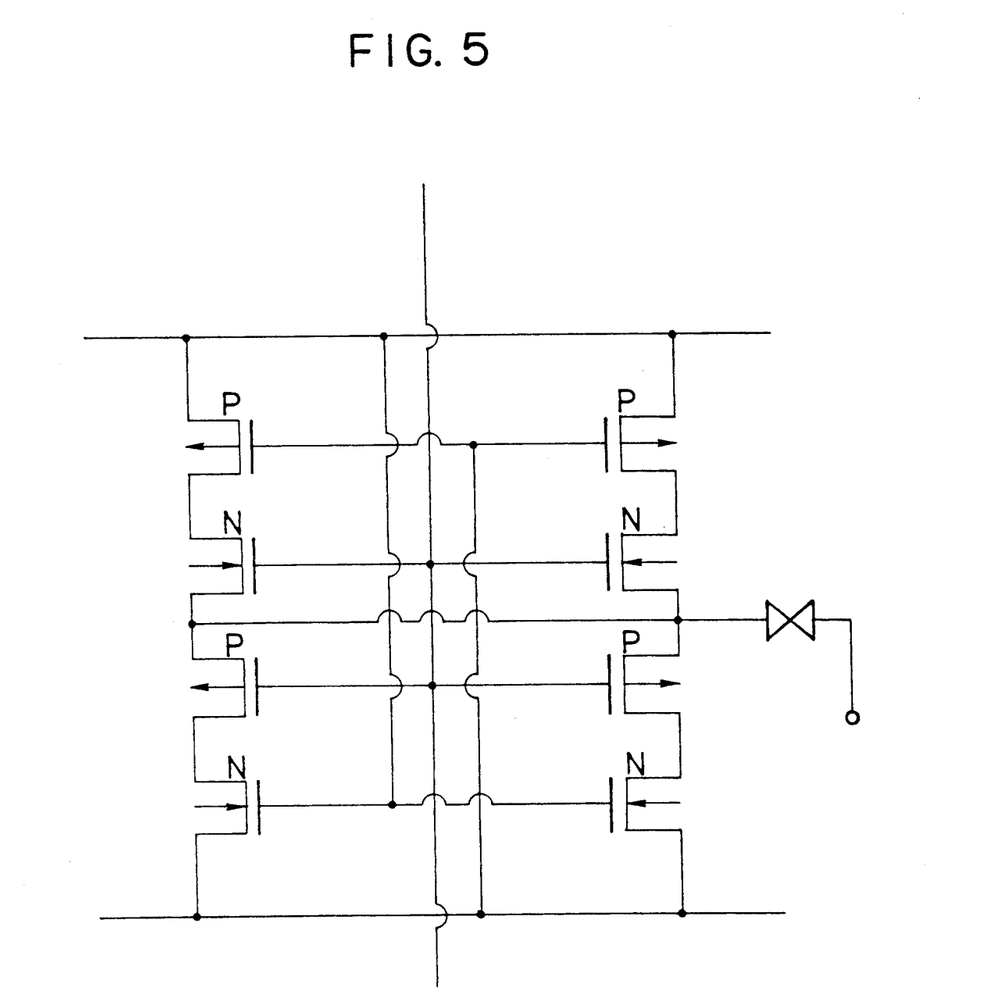
FIG. 5 is another circuit diagram of an electro-optical device according to this invention.
Figure 8:
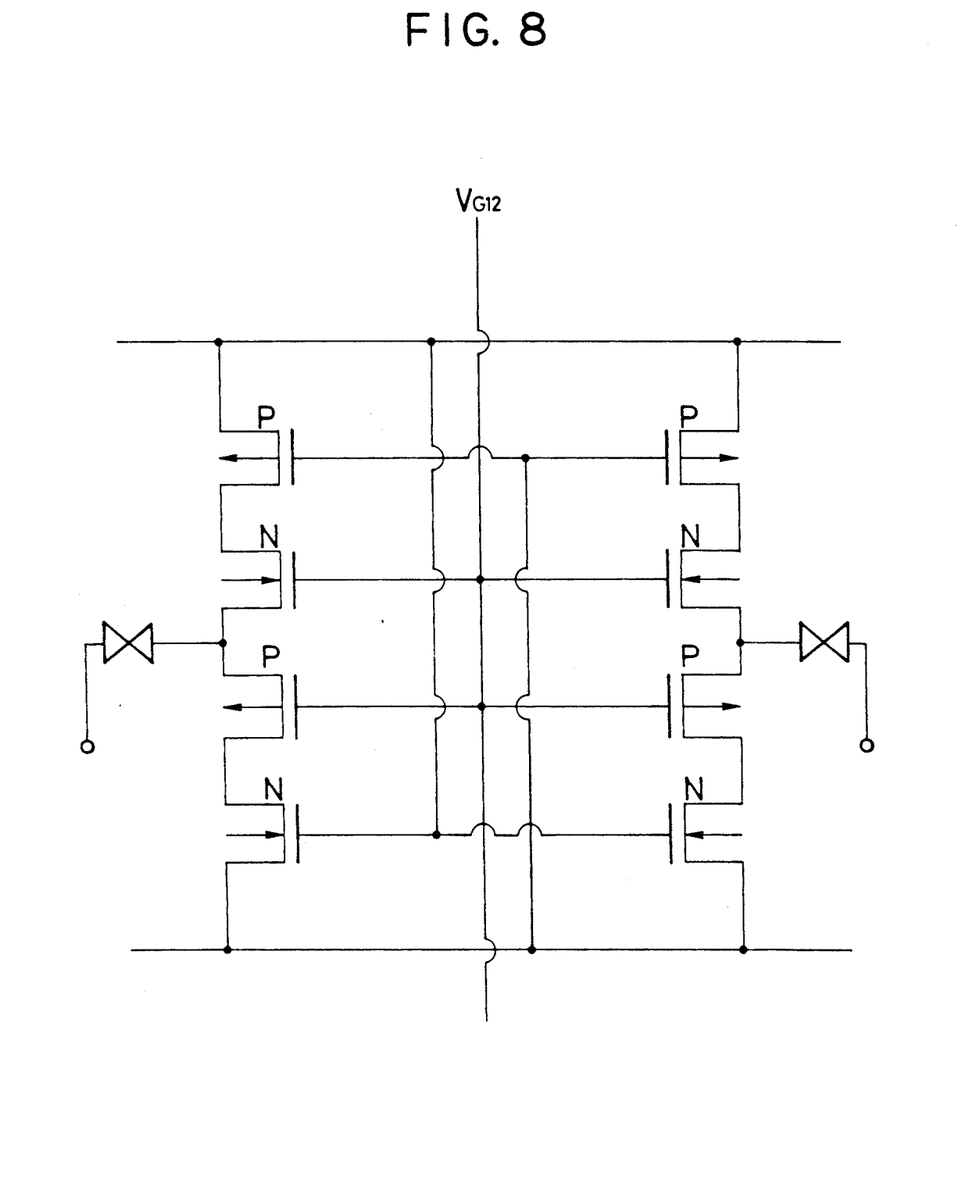
FIG. 8 is another circuit diagram of an electro-optical device according to this invention.

FIGS. 1, 5 and 8 are circuit diagrams of representative embodiments of electro-optical devices according to this invention.

A first embodiment as shown in FIG. 1 will be first described.

Figure 2:
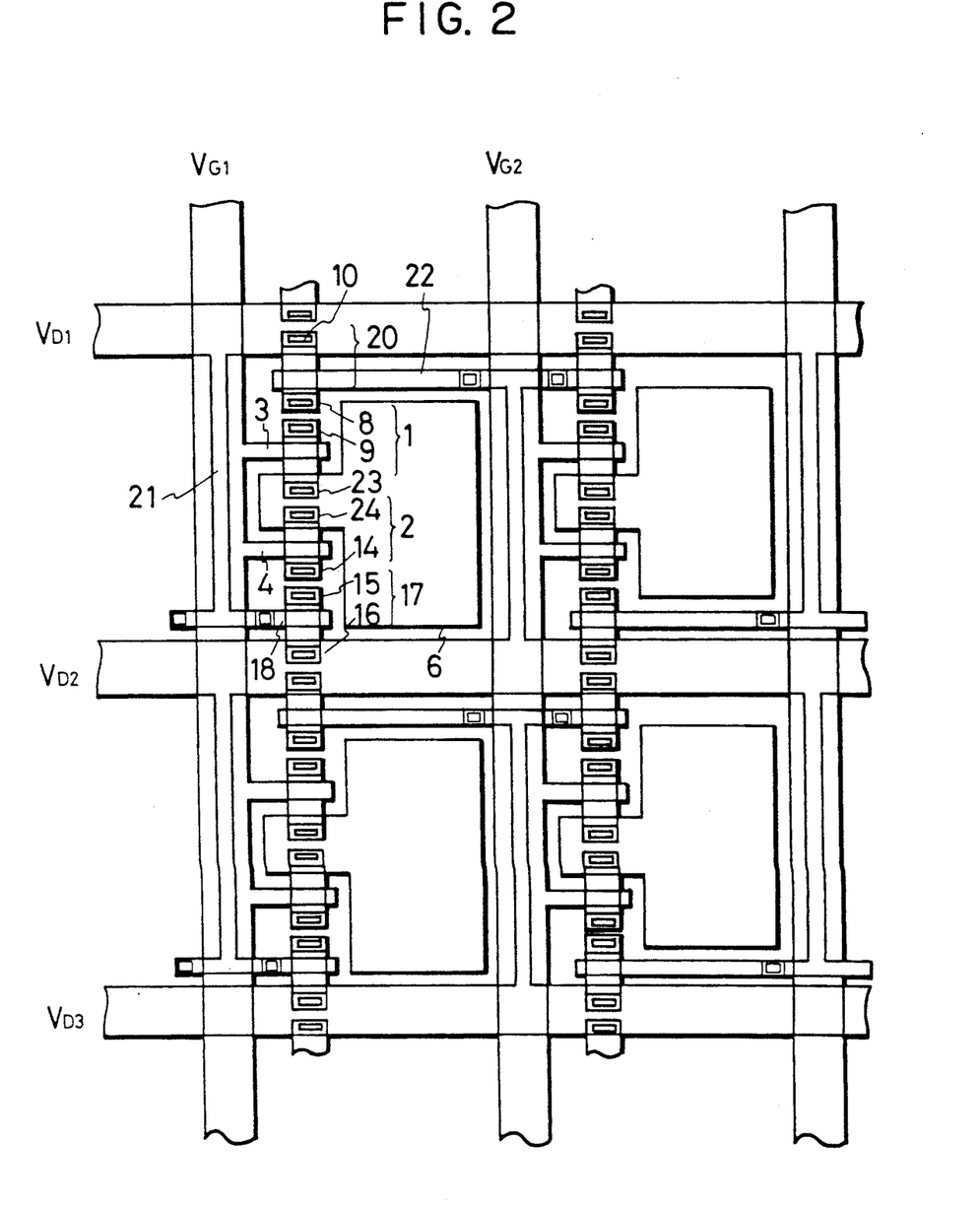
FIG. 2 shows an element arrangement of the electro-optical device according to this invention.

FIG. 2 shows an actual pattern layout (layout drawing) of the circuit as shown in FIG. 1. To simplify the description, a 2×2 matrix arrangement is representatively illustrated in FIGS. 1 and 2.

In FIG. 1, a first NTFT (N-channel thin film transistor) 1 and a first PTFT (P-channel thin film transistor) 2 are complementarily connected to each other to constitute a complementary thin film transistor (hereinafter referred to as "C/TFT") for a picture element (in this case, a picture element at an upper and left side of the drawing). A gate electrode 3 of the first NTFT 1 and a gate electrode 4 of the first PTFT 2 are connected to each other, and further commonly connected to a third signal line $V_{G1}$ in the Y-axial direction for driving the gate electrode of the C/TFT for each picture element. The common output terminal of the C/TFT is connected to a picture element electrode of a liquid crystal portion 7. In addition, an input terminal 8 of the first NTFT 1 is connected to an output terminal 9 of the second PTFT 20 while an input terminal 10 of the second PTFT 20 is connected to a first signal line $V_{D1}$ in the X-axial direction, and a gate electrode 12 of the second PTFT 20 is connected to a second signal line $V_{D2}$ in the X-axial direction.

Further, an output terminal 14 of the first PTFT 2 is connected to an input terminal 15 of a second NTFT 17 while an output terminal 16 of the second NTFT 17 is connected to the second signal line $V_{D2}$ in the X-axial direction, and a gate 18 of the second NTFT 17 is connected to the first signal line $V_{D1}$ in the X-axial direction. As shown in FIG. 1, the second signal line $V_{D2}$ for the picture element is further connected to the input terminal of a second PTFT and the gate electrode of a second NTFT for another picture element (at lower and left side in FIG. 1) which is adjacent through the second signal line $V_{D2}$ to the picture element. That is, the second signal line $V_{D2}$ is commonly used for the neighboring two picture elements at the upper-and-left and lower-and-left sides in FIG. 1.

In the display device thus constructed, when a display (ON) signal is applied to the third signal line $V_{G1}$ during a selection (ON) signal being applied between the pair of first and second signal lines $V_{D1}$ and $V_{D2}$, the gate electrode 12 of the second PTFT 20 and the gate electrode 18 of the second NTFT 17 are forwardly biased and thus the second PTFT 20 and the second NTFT 17 are switched to a conducting (ON) state, so that the liquid crystal potential $(V_{LC})$ 19 is controlled by the operation of the first NTFT 1 and the first PTFT 2.

The operation of the first NTFT 1 and the first PTFT 2 is controlled by the signal line $V_{G1}$ which is connected through the gate electrodes 3 and 4 to the first NTFT 1 and the first PTFT 2. An operating condition of the display device is represented as follows using a voltage $(V_G)$ of the third signal line $V_{G1}$, a voltage $(V_{D1})$ of the first signal line $V_{D1}$, a voltage $(V_{D2})$ of the second signal line $V_{D2}$, the liquid crystal potential 19 $(V_{LC})$, and a threshold voltage $(V_{TH})$ of the TFT transistor:

(1) For $V_G > V_{TH}(NTFT\ 1)$,
$V_{LC}19 \approx \{V_G - V_{TH}(NTFT\ 1)\}$ (2) For $V_G < V_{TH}(PTFT\ 2)$,
$V_{LC}19 \approx \{V_G - V_{TH}(PTFT\ 2)\} > V_{D2}$ (3) For $V_{TH}(NTFT\ 1) > V_G > V_{TH}(PTFT\ 2)$,
$V_{TH}(NTFT\ 1) > V_{LC} > V_{TH}(PTFT\ 2)$ Inversely, when the first and second signal lines $V_{D1}$ and $V_{D2}$ are in an non-selection state (are set to off-state values), that is, $V_{D1} \approx V_{D2}$ or $V_{D1} < V_{D2}$ during the third signal line $V_{G1}$ being supplied with the display (On) signal, the second PTFT 20 and the second NTFT 17 are reversely biased, and thus the second PTFT 20 and the second NTFT 17 are switched to an insulating state. Therefore, the above condition for the operation of the first NTFT 1 and the first PTFT 2 is satisfied, and the liquid crystal potential 19 $(V_{LC})$ is kept to an insulated state from other potentials even though the first NTFT 1 and the first PTFt 2 are switched to the conducting state. As a result, the liquid crystal potential 19 $(V_{LC})$ is not varied irrespective of the third signal line $V_{G1}$ (that is, is kept at an unselectable state by the third signal line), and thus the present level of the liquid crystal potential 19 $(V_{LC})$ remains unvaried.

As described above, the liquid crystal potential or a potential difference $(V_{LC})$ to be supplied to the liquid crystal can be arbitrarily varied not only by changing a signal voltage to be supplied to a second signal line $V_{D2}$ for a picture element which is located in the neighborhood of a first signal line $V_{D1}$ for the picture element and which also serves as a first signal line of another picture element adjacent to the picture element, but also by changing a signal voltage to be supplied to a third signal line $V_{G1}$.

Further, a counter electrode of the liquid crystal portion 7 is supplied with an offset voltage $(V_{OFFSET})$ (not shown), and thus the actual voltage to be supplied to the liquid crystal is a voltage of $(V_{D1} + V_{OFFSET})$ or $(V_{D2} + V_{OFFSET})$. In the operation of the display device according to this invention, the offset voltage $(V_{OFFSET})$ to be supplied to the counter electrode may be variable to arbitrarily alter the On and Off operation of the liquid crystal. In addition, a threshold voltage used to actually drive the liquid crystal is varied in accordance with the kind of the used liquid crystal, but the variable offset voltage $(V_{OFFSET})$ can be matched to any threshold voltage of various liquid crystal materials, so that any liquid crystal material can be used in this invention.

EXAMPLE

Example 1

Referring to FIGS. 3(A) to 3(F), a liquid crystal display device in accordance with a first embodiment of the present invention will be described below. In FIGS. 3(A) to 3(F), only the portion corresponding to the first NTFT and PTFT is representatively illustrated to simplify the description.

Figure 3A:
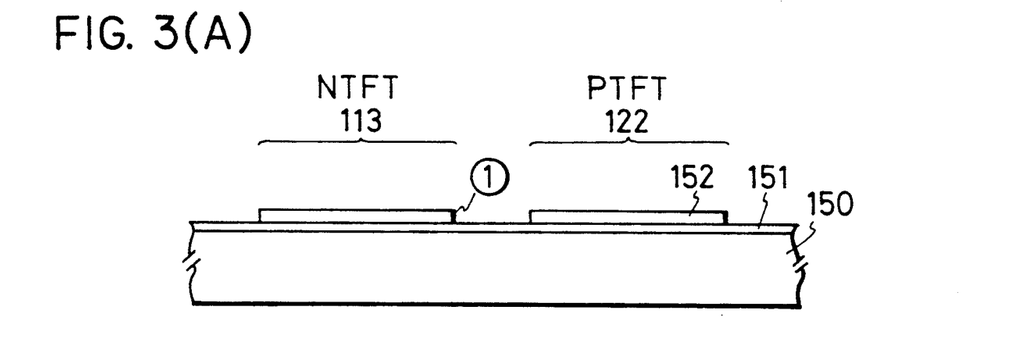

In FIG. 3(A), inexpensive glass 150 which has a heat-resistance to a temperature below 700° C., for example, about 600° C. was subjected to a magnetron RF (radio frequency) sputtering process to form a blocking layer 151 comprising silicon oxide film of 1000 to 3000 Å in thickness on the glass substrate 150 under the following conditions: 100% oxygen atmosphere, 15° C. film forming temperature, an output power of 400 to 800 W, a pressure of 0.5 Pa, and a film forming speed of 30 to 100 Å/minute for a target of quartz or monocrystal silicon.

Thereafter, an amorphous silicon film 152 was formed on the blocking layer 151 by LPCVD (low pressure chemical vapor deposition) method, a sputtering method or a plasma CVD method.

In the LPCVD method, disilane $(Si_2H_6)$ or trisilane $(Si_3H_8)$ was supplied to a CVD device at a temperature of 450° to 550° C. which was lower than the crystallization temperature of the silicon by 100° to 200° C., for example, at 530° C. to form the silicon film 152 on the blocking layer 151. A pressure in a reactor was set to 30 to 300 Pa, and a film forming speed was set to 50 to 250 Å/minute. In order to substantially equalize threshold voltages (Vth) of the NTFT and the PTFT, boron of $1 \times 10^{15}$ to $1 \times 10^{18} cm^{-3}$ concentration may be doped into the silicon film 152 using diborane.

In the sputtering method, a back pressure before the sputtering operation was set to a value below $1 \times 10^{-5}$ Pa, and film formation was performed using a target of monocrystal silicon under the following conditions:

atmosphere containing argon and hydrogen of 20 to 80%, for example, atmosphere containing 20% argon and 80% hydrogen, a film forming temperature of 150° C., a sputtering frequency of 13.56 MHz, a sputtering output power of 400 to 800 W and a pressure of 0.5 Pa.

In the plasma CVD method, a silicon film was formed by introducing monosilane ($SiH_4$) or disilane ($Si_2H_6$) into a PCVD device, and supplying the introduced materials with high frequency power of 13.56 MHz at a film forming temperature of 300° C.

It is preferable that the silicon film formed in the above methods has an oxygen concentration below $5 \times 10^{21} cm^{-3}$. If the oxygen concentration is higher than the above concentration, the silicon is hardly crystallized, and a heat annealing temperature (or time) must be higher (or longer). On the other hand, if the oxygen concentration is excessively low, a leak current in the off-state is increased by a back light. Therefore, the oxygen concentration was set to a range of $4 \times 10^{19}$ to $4 \times 10^{21} cm^{-3}$. The hydrogen concentration was $4 \times 10^{20} cm^{-3}$, and corresponds to one atomic percentage of the silicon concentration of $4 \times 10^{22} cm^{-3}$. In addition, in order to promote the crystallization of the source and drain, the oxygen concentration may be set below $7 \times 10^{19} cm^{-3}$, preferably below $1 \times 10^{19} cm^{-3}$ while the oxygen of $5 \times 10^{20}$ to $5 \times 10^{21} cm^{-3}$ is doped into only channel forming areas of the TFTs constituting pixels by an ion implantation method. In this case, in order to enable the device to operate at a high frequency, the doping amount of oxygen into TFTs used for peripheral circuits may be more reduced so that the TFTs have high carrier mobility because the TFTs used for peripheral circuits are not exposed to light.

After the amorphous silicon film of 500 to 5000 Å, for example, 1500 Å in thickness was formed, the silicon film was subjected to a heat-treatment of an intermediate temperature at 450° to 700° C. under non-oxide atmosphere, for example, the silicon film was kept at 600° C. under hydrogen atmosphere for 12 to 70 hours. Since amorphous silicon oxide film was formed on the surface of the substrate beneath the silicon film, the whole silicon film was homogeneously heat-annealed in the absence of particular crystalline nucleus through the heat-treatment. That is, in the film forming process, the silicon film has amorphous structure, and the hydrogen is merely mixed into the silicon film.

In the annealing process, the silicon film is phase-changed from amorphous structure to a highly-ordered state, and a part thereof has crystallinity. Particularly, a relatively highly-ordered area of the silicon film after the film forming process is liable to be crystallized into a crystal state. These relatively highly-ordered areas are coupled through silicon atoms located therebetween, and thus the silicon atoms are pulled by each other. In a laser Raman spectroscopic measurement, a peak shifted to a lower frequency side than a peak (522 $cm^{-1}$) of monocrystal silicon was observed. An apparent particle diameter of these areas was measured to be 50 to 500 Å, and apparently had a structure like the micro-crystal structure. However, there were many areas which have such a highly-crystalline structure, and some areas constituted a cluster structure. Therefore, the thus formed silicon film had a semi-amorphous structure that the neighboring clusters were coupled (anchored) to each other through silicon atoms.

As a result, the formed silicon film has a state that substantially no grain boundary (hereinafter referred to as "GB") exists in the film. Carriers are easily moved through an anchored portion of the neighboring clusters, and thus this silicon film has a higher carrier mobility than a polycrystal silicon having distinct grain boundaries. For example, in this embodiment, a hole mobility ($\mu h = 10$–$200 cm^2/Vsec$), and an electron mobility ($\mu e = 15$–$300 cm^2/Vsec$) were obtained.

If a high-temperature annealing process at 900° to 1200° C. is conducted on the silicon film in place of the intermediate-temperature annealing process as described above to polycrystallize the formed film, segregation of impurities in the film would occur through solid-phase growth from a nucleus, so that oxygen, carbon, nitrogen and other concentrations are increased in the GBs and the mobility in the crystal is also increased whereas a barrier is formed at the GB and thus the carriers are prevented from moving through the GBs. As a result, in actual use, mobility above 10 $cm^2/Vsec$ is hardly obtained. In view of the above point, in this embodiment, silicon semiconductor having semi-amorphous or semi-crystal structure was used for the silicon film.

In FIG. 3(A), the silicon film thus formed was subjected to a photoetching process through a first photomask ① to form a PTFT area 122 (having a channel width of 20 ($\mu m$)) and an NTFT area 113 at right and left sides of the drawing, respectively.

Next, a silicon oxide film having a thickness of 500 to 2000 Å, for example, 1000 Å was formed as a gate insulating layer 154 over the silicon film 152 and the exposed silicon oxide layer 151. The same silicon oxide film forming condition for the blocking layer was also used for the gate insulating layer. A small amount of fluoride may be doped into the silicon oxide film 154 to fix sodium ions.

Figure 3B:
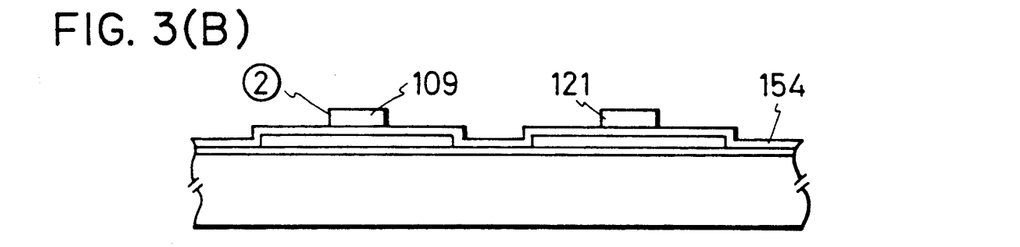

Thereafter, on the gate insulating film was formed a silicon film containing phosphorus of 1 to $5 \times 10^{21} cm^{-3}$ or a multi-layered film comprising the above silicon film containing phosphorus and molybdenum (Mo), tungsten (W), $MoSi_2$ or $WSi_2$ film. As shown in FIG. 3 (B), the silicon film or multi-layered film was subjected to a patterning process using a second photomask ② to obtain a gate electrode 121 for the PTFT and a gate electrode 109 for the NTFT in such a manner that the gate electrodes had a channel length of 10 $\mu m$. Each gate electrode comprised, for example, a phosphorus-doped silicon layer of 0.2 $\mu m$ and a molybdenum layer of 0.3 $\mu m$ thereon.

Figure 3C:
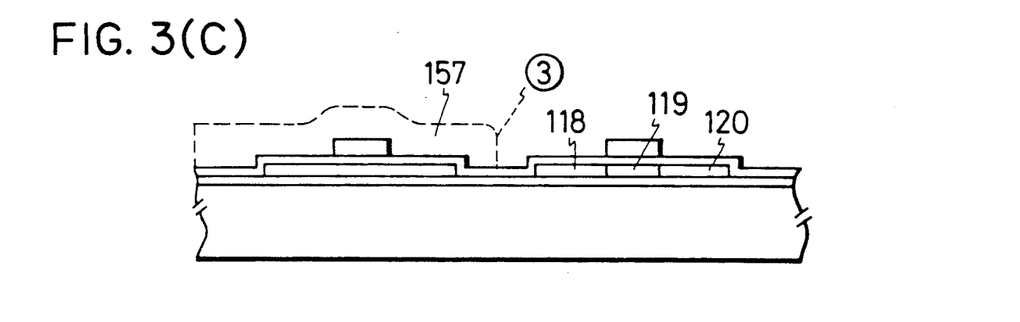
Figure 3D:
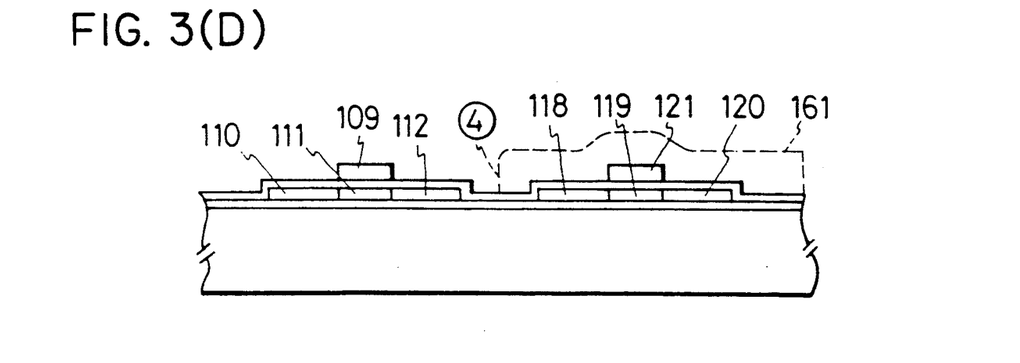

As shown in FIG. 3(C), a photoresist 157 was formed using a photomask ③, and boron of 1 to $5 \times 10^{15} cm^{-2}$ was doped into portions corresponding to the source 118 and drain 120 of the PTFT 122 by the ion implantation method. Next, as shown in FIG. 3(D), a photoresist 161 was formed using a photomask ④, and phosphorus of 1 to $5 \times 10^{15} cm^{-2}$ was doped into portions corresponding to the source 110 and drain 112 of the NTFT 113 by the ion implantation method. These doping operations were carried out through the gate insulating layer 154. However, in FIG. 3(B), the silicon oxide on the silicon film may be removed by using the gate electrodes 121 and 109 as a mask, and then boron and phosphorus may be directly doped into the silicon film.

Next, the intermediate board thus constructed was again subjected to heat-annealing process at 600° C. for 10 to 50 hours. Impurities doped into the source 118 and the drain 120 of the PTFT 122 and the source 110 and drain of the NTFT 113 were activated to form these areas into P+ and N+ areas. Further, channel forming areas 119 and 111 of semi-amorphous semiconductor were formed beneath the gate electrodes 121 and 109, respectively.

As described above, the C/TFT can be formed without increasing the heat temperature above 700° C. in all processes irrespective of a self-aligning system. Therefore, expensive material such as quartz is not required for the substrate of this invention, and thus the above processes are very suitable for manufacturing a liquid crystal device having a large number of picture elements.

Figure 3E:
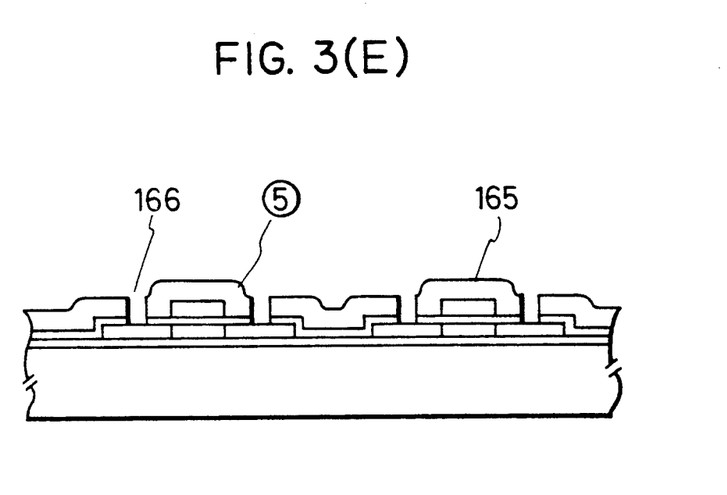

In this embodiment, the heat-annealing treatment was carried out twice in the processes as shown in FIGS. 3(A) and 3(D). However, the annealing treatment as shown in FIG. 3(A) may be eliminated in accordance with characteristics of TFTs to be finally obtained, and both of the annealing treatments may be commonly carried out by the annealing process as shown in FIG. 3(D) to thereby shorten a manufacturing time. In FIG. 3(E), an interlayer insulating film of silicon oxide was also formed by the sputtering method as described above. This silicon oxide film serving as an interlayer insulating film may be formed by a LPCVD method, a photo-CVD method, or a normal pressure CVD method. In this first embodiment, the interlayer insulating film of 0.2 to 0.6 μm thickness was formed, and then openings 166 for the electrodes were formed using a photomask ⑤. Thereafter, aluminum was deposited on the whole surface of the board, and leads 171 and 172 and contacts 167 and 168 were formed on the board using a photomask ⑥. Thereafter, the surface of the board was coated with floating organic resin 169, for example, transparent polyimide resin, and then holes for the electrodes were made using a photomask ⑦ again to form a final board having the NTFT and the PTFT.

Figure 3F:
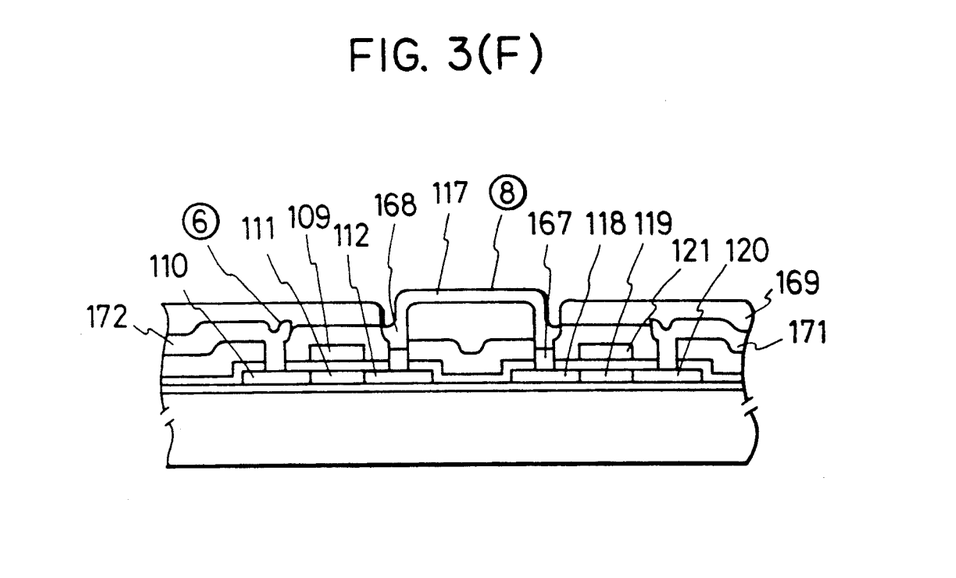
Figure 4:
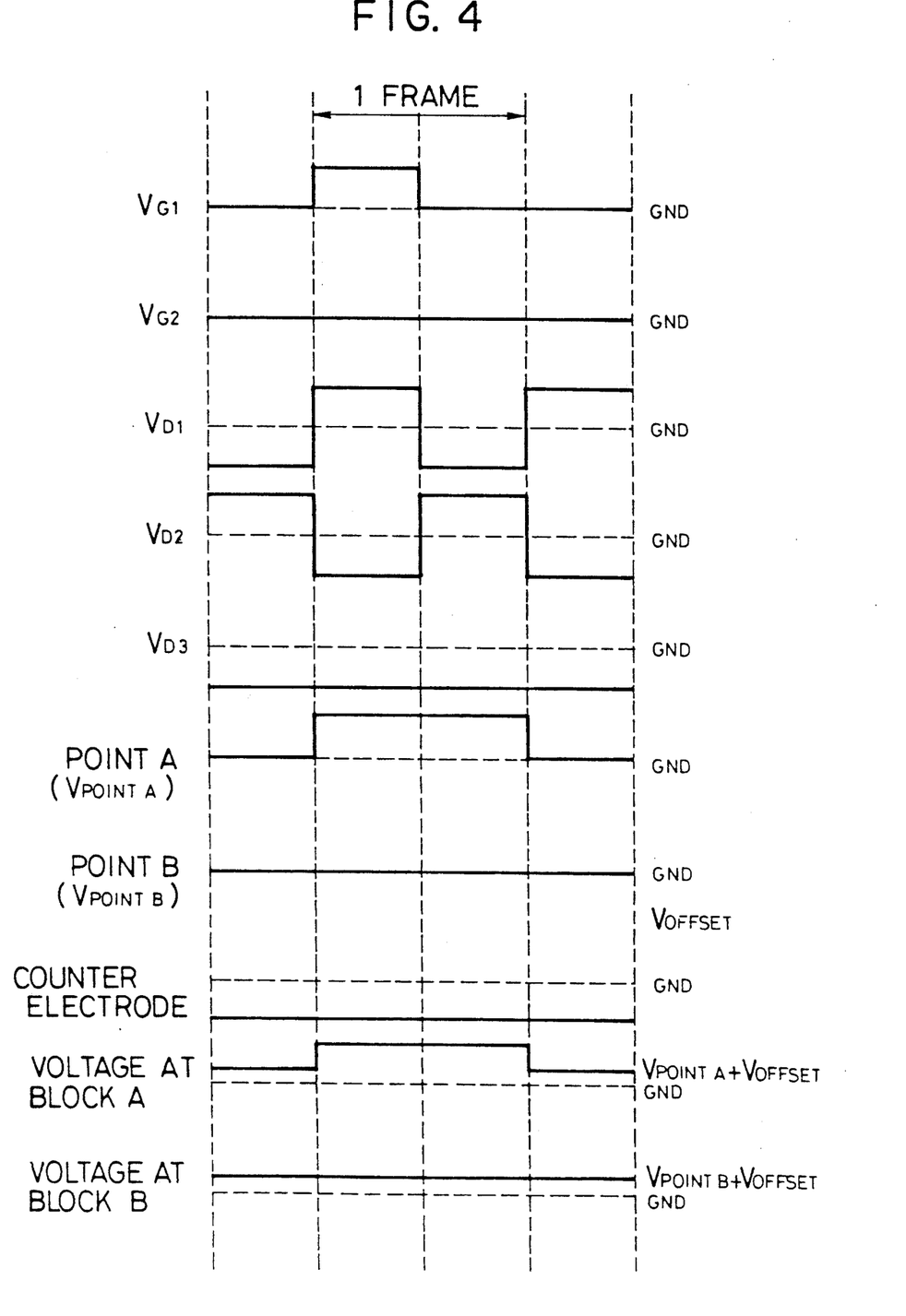
FIG. 4 is a time chart of driving waveforms for the electro-optical device according to this invention.

In order to complementarily connect the two TFTs as shown in FIG. 3(F) to form a complementary TFT on the board, to form a transparent picture element electrode of the liquid crystal portion 7 and to connect the output terminal of the complementary TFT to the transparent picture element electrode of the liquid crystal portion 7, an ITO (indium tin oxide) film was formed on the board by the sputtering method. The ITO film was etched using a photomask ⑧ to form an electrode 117 for the transparent conductive film (picture element electrode). The ITO film was formed at room temperature to 150° C., and then subjected to annealing treatment at 200° to 400° C. under oxygen or air atmosphere. In the above manner, the PTFT 122, the NTFT 113 and the electrode 117 for the transparent conductive film were formed on the same glass substrate 150. The PTFT thus formed had mobility of 20 (cm$^2$/Vs) and Vth of −5.9 (V), and the NTFT thus formed had mobility of 40 (cm$^2$/Vs) and Vth of 5.0 (V).

The thus formed board serving as one of the substrates of the liquid crystal display device and the other glass substrate formed with a transparent electrode over the whole surface thereof were laminated to form a liquid crystal cell, and TN liquid crystal material was injected into a space between the laminated substrates.

As shown in FIG. 2, the liquid crystal display device as formed in the above processes has a matrix arrangement in which the NTFT 1 and the PTFT 20 are further formed at the intersecting portion of the first signal line $V_{D1}$ and the third signal line $V_{G1}$ while the PTFT 2 and the NTFT 17 are further provided at the intersecting portion of the second signal line $V_{D2}$ and the third signal line $V_{G1}$.

The drain 10 of the PTFT 20 is connected to the first signal line $V_{D1}$ through the contact at the input terminal thereof, and the gate 12 of the PTFT 20 is connected to the multi-layered signal line $V_{D2}$ through a wiring 22. The output terminal of the source 9 of the PTFT 20 is connected to the drain 8 of the NTFT 1 through a diffused layer, and the source 23 of the NTFT 1 is connected to the picture element electrode 6 through the contact. The gate 3 of the NTFT 1 is connected to the third signal line $V_{G1}$.

The drain 16 of the NTFT 17 is connected to the second signal line $V_{D2}$ through the contact of the input terminal thereof, and the gate 18 of the NTFT 17 is connected to the multi-layered signal line $V_{D1}$ through a wiring 21. The output terminal of the source 15 of the NTFT 17 is connected to the drain 14 of the PTFT 2 through a diffused layer, and the source 24 of the PTFT 2 is connected to the picture element electrode 6 through the contact. The gate 4 of the PTFT 2 is also connected to the third signal line $V_{G1}$.

The above circuit arrangement of 2×2 matrix is repetitively formed in up-and-down and left-and-right directions on the board to obtain a liquid crystal display device having an arrangement of a large number of picture elements such as a 640×480 matrix arrangement, a 1280×960 matrix arrangement or the like.

According to this invention, a lap-top type display device, a projection type display device, a view finder for a video camera and so on can be manufactured in the substantially same construction and process as described above.

In this embodiment, the display device has a construction that an assembly of thin film transistors are assigned to each picture element. However, this invention is not limited to the above construction. For example, each picture element may be formed by plural picture element electrodes, and an assembly of thin film transistors may be assigned to each picture element electrode, or plural assemblies of thin film transistors may be assigned to each picture element. In this case, even if some of TFTs have malfunction, the other TFTs can serve to compensate for the malfunction or areal grey scan can be performed.

The display medium of this invention is applicable to both of a transmission-type liquid crystal display device and a reflection-type liquid crystal display device. TN (twisted nematic) liquid crystal, ferroelectric liquid crystal, dispersion-type liquid crystal or polymer-type liquid crystal may be used for the electro-optical modulating layer in this invention. In addition thereto may be used a phase-transition type liquid crystal containing a mixture of a nematic liquid crystal and a cholesteric liquid crystal, in which guest-host type or dielectric anisotropic type nematic liquid crystal is added with ionic dopant and supplied with an electric field to form nematic liquid crystal, and a mixture of the nematic liquid crystal and the cholesteric liquid crystal is supplied with an electric field to develop its phase-change between the nematic phase and the cholesteric phase, thereby realizing a transparent or white opaque display. As material other than liquid crystal material may be used an electrophoretically displaying dispersion material in which color pigment particles are dispersed in an organic solvent which is colored with dye having different color from the pigment particles. Also, the electro-optical modulating layer may comprise a transparent solid substance and a liquid crystal.

According to the display device of this invention, the liquid crystal potential is not floated, so that the display operation is stably carried out. In addition, the C/TFT serving as an active element has a high driving capability, so that the operating margin can be widened and the peripheral driving circuits can be simplified in construction. Therefore, the display device can be wholly simplified, and the manufacturing cost can be reduced. The three signal lines and the counter electrode are allowed to display their high driving capability using simple signals.

Further, even if some TFTs have malfunction, the other TFTs can compensate for the malfunction to some extent because they carry out in-phase outputting operations. In addition, a signal line can be commonly used between neighboring picture elements, and only two signal lines are sufficient for each picture element, so that the aperture ratio can be improved.

The present invention can be applied to electric circuits illustrated in FIGS. 5 and 8. In FIG. 5, two assemblies of transistors are connected to a pixel electrode (picture element electrode) provided on one of a pair of substrates of an electro-optical device. Each assembly of transistors comprise two n-channel transistors and two p-channel transistors connected to the pixel electrode in the same manner as in the electric circuit of FIG. 1, as shown in FIG. 5. Even if one of the two assemblies malfunction, the other one of the two assemblies can normally function in the electric circuit of FIG. 5. Thus, the two assemblies of transistors can normally function as a whole, for example by disconnecting said one of the two assemblies by irradiation of a laser beam. In FIG. 8, two assemblies of transistors are connected to two pixel electrodes (picture element electrodes) respectively. Each assembly of transistors comprise two n-channel transistors and two p-channel transistors connected to corresponding one of the two pixel electrodes in the same manner as in the electric circuit of FIG. 1, as shown in FIG. 8. Further, the two assemblies are connected to only one gate signal line $V_{G12}$ as shown in FIG. 8. Therefore, the electro-optical device utilizing the electric circuit of FIG. 8 has a larger aperture ratio than that utilizing the electric circuit of FIG. 1.

What is claimed is:

1. An electro-optical device comprising:
 a pair of substrates;
 an electro-optical modulating layer provided between said substrates;
 a column control line provided on one of said substrates;
 two row control lines $R_1$ and $R_2$ provided on said one of said substrates;
 an electrode provided on said one of said substrates between said two row control lines;
 a first p-channel transistor $P_1$ and a first n-channel transistor $N_1$ which are provided on said one of said substrates and connected to said column control line at gate terminals of the transistors $P_1$ and $N_1$, and to said electrode at one of source and drain terminals of said first p-channel transistor $P_1$ and at one of source and drain terminals of said first n-channel transistor $N_1$;
 a second p-channel transistor $P_2$ provided on said one of said substrates and connected to the row control line $R_1$ at one of source and drain terminals of the transistor $P_2$, to the row control line $R_2$ at a gate terminal of the transistor $P_2$, and to the other one of the source and drain terminals of said first n-channel transistor $N_1$ at the other one of the source and drain terminals of said second p-channel transistor $P_2$; and
 a second n-channel transistor $N_2$ provided on said one of said substrates and connected to the row control line $R_2$ at one of source and drain terminals of the transistor $N_2$, to the row control line $R_1$ at a gate terminal of the transistor $N_2$, and to the other one of the source and drain terminals of said first p-channel transistor $P_1$ at the other one of the source and drain terminals of said second n-channel transistor $N_2$.

2. The device of claim 1 wherein said electro-optical modulating layer comprises a liquid crystal selected from the group consisting of a twisted nematic liquid crystal, ferroelectric liquid crystal, a guest-host type liquid crystal and a phase transition type liquid crystal.

3. The device of claim 1 wherein channels of the transistors comprise a semi-amorphous silicon.

4. The device of claim 1 wherein said electro-optical modulating layer comprises a transparent solid substance and a liquid crystal.

5. The device of claim 1 further comprising an electrode provided on the other one of said substrates.

6. The device of claim 1 wherein the other one of the source and drain terminals of said first n-channel transistor $N_1$ is connected to the other one of the source and drain terminals of said second p-channel transistor $P_2$ through a diffused layer.

7. The device of claim 1 wherein said electro-optical modulating layer comprises a color pigment particle and an organic solvent.

8. An electro-optical device comprising:
 a pair of substrates;
 an electro-optical modulating layer provided between said substrates;
 pixels $A_{mn}$ ($1 \leq m \leq s$; $1 \leq n \leq t$; and s, t, m, and n are natural numbers) arranged in a matrix of $s \times t$ on one of said substrates, the pixels $A_{m1}, A_{m2}, \ldots, A_{mt}$ being arranged on an mth row, and the pixels $A_{1n}, A_{2n}, \ldots, A_{sn}$ being arranged on an nth column;
 row control lines $R_1, R_2, \ldots, R_{s+1}$ provided on said one of said substrates, the row control line $R_m$ being provided on the mth row, and the row control line $R_{s+1}$ being provided on an (s+1)th row; and
 column control lines $C_1, C_2, \ldots, C_t$ provided on said one of said substrates, the column control line $C_n$ being provided on the nth column,
 the pixel $A_{XY}$ ($1 \leq X \leq s-1$, $1 \leq Y \leq t$) comprising:
 an electrode $E_{XY}$ provided on said one of said substrates;
 a p-channel transistor $P_{XY1}$ and an n-channel transistor $N_{XY1}$ which are provided on said one of said substrates and connected to the column control line $C_Y$ at gate terminals of the transistors $P_{XY1}$ and $N_{XY1}$, and to said electrode $E_{XY}$ at one of source and drain terminals of the transistor $P_{XY1}$ and at one of source and drain terminals of the transistor $N_{XY1}$;
 a p-channel transistor $P_{XY2}$ provided on said one of said substrates and connected to the row control line $R_X$ at one of source and drain terminals of the transistor $P_{XY2}$, to the row control line $R_{X+1}$ at a gate terminal of the transistor $P_{XY2}$, and to the other one of the source and drain terminals of the transistor $N_{XY1}$ at the other one of the source and drain terminals of the transistor $P_{XY2}$; and an n-channel transistor $N_{XY2}$ provided on said one of said substrates and connected to the row control line $R_{X+1}$ at one of source and drain terminals of the transistor $N_{XY2}$, to the row control line $R_X$ at a gate terminal of the transistor $N_{XY2}$, and to the other one of the source and drain terminals of the transistor $P_{XY1}$ at the other one of the source and drain terminals of the transistor $N_{XY2}$, and the pixel $A_{(X+1)Y}$ comprising:

an electrode $E_{(X+1)Y}$ provided on said one of said substrates;

a p-channel transistor $P_{(X+1)Y1}$ and an n-channel transistor $N_{(X+1)Y1}$ which are provided on said one of said substrates and connected to the column control line $C_Y$ at gate terminals of the transistors $P_{(X+1)Y1}$ and $N_{(X+1)Y1}$, and to said electrode $E_{(X+1)Y}$ at one of source and drain terminals of the transistor $P_{(X+1)Y1}$ and at one of source and drain terminals of the transistor $N_{(X+1)Y1}$;

a p-channel transistor $P_{(X+1)Y2}$ provided on said one of said substrates and connected to the row control line $R_{X+1}$ at one of source and drain terminals of the transistor $P_{(X+1)Y2}$, to the row control line $R_{X+2}$ at a gate terminal of the transistor $P_{(X+1)Y2}$, and to the other one of the source and drain terminals of the transistor $N_{(X+1)Y1}$ at the other one of the source and drain terminals of the transistor $P_{(X+1)Y2}$; and an n-channel transistor $N_{(X+1)Y2}$ provided on said one of said substrates and connected to the row control line $R_{X+2}$ at one of source and drain terminals of the transistor $N_{(X+1)Y2}$, to the row control line $R_{X+1}$ at a gate terminal of the transistor $N_{(X+1)Y2}$, and to the other one of the source and drain terminals of the transistor $P_{(X+1)Y1}$ at the other one of the source and drain terminals of the transistor $N_{(X+1)Y2}$.

9. An electro-optical device comprising:

a pair of substrates;

an electro-optical modulating layer provided between said substrates;

a column control line provided on one of said substrates;

two row control lines $R_1$ and $R_2$ provided on said one of said substrates;

an electrode provided on said one of said substrates between said two row control lines;

two first p-channel transistors $P_1$ and $P_{11}$ and two first n-channel transistors $N_1$ and $N_{11}$ which are provided on said one of said substrates and connected to said column control line at gate terminals of the transistors $P_1$, $P_{11}$, $N_1$, and $N_{11}$, and to said electrode at one of source and drain terminals of each of said two first p-channel transistors $P_1$ and $P_{11}$ and at one of source and drain terminals of each of said two first n-channel transistors $N_1$ and $N_{11}$;

two second p-channel transistors $P_2$ and $P_{22}$ which are provided on said one of said substrates and connected to the row control line $R_1$ at one of source and drain terminals of each of said two second p-channel transistors $P_2$ and $P_{22}$, to the row control line $R_2$ at gate terminals of the transistors $P_2$ and $P_{22}$, and to the other one of the source and drain terminals of each of said two first n-channel transistors $N_1$ and $N_{11}$ at the other one of the source and drain terminals of corresponding one of said two second p-channel transistors $P_2$ and $P_{22}$; and two second n-channel transistors $N_2$ and $N_{22}$ which are provided on said one of said substrates and connected to the row control line $R_2$ at one of source and drain terminals of each of said two second n-channel transistors $N_2$ and $N_{22}$, to the row control line $R_1$ at gate terminals of the transistors $N_2$ and $N_{22}$, and to the other one of the source and drain terminals of each of said two first p-channel transistors $P_1$ and $P_{11}$ at the other one of the source and drain terminals of corresponding one of said two second n-channel transistors $N_2$ and $N_{22}$.

10. The device of claim 9 wherein said electro-optical modulating layer comprises a liquid crystal selected from the group consisting of a twisted nematic liquid crystal, ferroelectric liquid crystal, a guest-host type liquid crystal and a phase transition type liquid crystal.

11. The device of claim 9 wherein channels of the transistors comprise a semi-amorphous silicon.

12. The device of claim 9 wherein said electro-optical modulating layer comprises a transparent solid substance and a liquid crystal.

13. The device of claim 9 further comprising an electrode provided on the other one of said substrates.

14. The device of claim 9 wherein said electro-optical modulating layer comprises a color pigment particle and an organic solvent.

15. An electro-optical device comprising:

a pair of substrates;

an electro-optical modulating layer provided between said substrates;

a column control line provided on one of said substrates;

two row control lines $R_1$ and $R_2$ provided on said one of said substrates;

two electrodes provided on said one of said substrates between said two row control lines $R_1$ and $R_2$;

a first p-channel transistor $P_1$ and a first n-channel transistor $N_1$ provided on said one of said substrates and connected to said column control line at gate terminals of the transistors $P_1$ and $N_1$, and to one of said two electrodes at one of source and drain terminals of said first p-channel transistor $P_1$ and at one of source and drain terminals of said first n-channel transistor $N_1$;

a second p-channel transistor $P_2$ provided on said one of said substrates and connected to the row control line $R_1$ at one of source and drain terminals of the transistor $P_2$, to the row control line $R_2$ at a gate terminal of the transistor $P_2$, and to the other one of the source and drain terminals of said first n-channel transistor $N_1$ at the other one of the source and drain terminals of said second p-channel transistor $P_2$;

a second n-channel transistor $N_2$ provided on said one of said substrates and connected to the row control line $R_2$ at one of source and drain terminals of the transistor $N_2$, to the row control line $R_1$ at a gate terminal of the transistor $N_2$, and to the other one of the source and drain terminals of said first p-channel transistor $P_1$ at the other one of the source and drain terminals of said second n-channel transistor $N_2$;

a third p-channel transistor $P_3$ and a third n-channel transistor $N_3$ which are provided on said one of said substrates and connected to said column control line at gate terminals of the transistors $P_3$ and $N_3$, and to the other one of said two electrodes at one of source and drain terminals of said third p-channel transistor $P_3$ and at one of source and drain terminals of said third n-channel transistor $N_3$;

a fourth p-channel transistor $P_4$ provided on said one of said substrates and connected to the row control line $R_1$ at one of source and drain terminals of the transistor $P_4$, to the row control line $R_2$ at a gate terminal of the transistor $P_4$, and to the other one of the source and drain terminals of said third n-channel transistor $N_3$ at the other one of the source and drain terminals of said fourth p-channel transistor $P_4$; and a fourth n-channel transistor $N_4$ provided on said one of said substrates and connected to the row control line $R_2$ at one of source and drain terminals of the transistor $N_4$, to the row control line $R_1$ at a gate terminal of the transistor $N_4$, and to the other one of the source and drain terminals of said third p-channel transistor $P_3$ at the other one of the source and drain terminals of said fourth n-channel transistor $N_4$.

16. The device of claim 15 wherein said electro-optical modulating layer comprises a liquid crystal selected from the group consisting of a twisted nematic liquid crystal, ferroelectric liquid crystal, a guest-host type liquid crystal and a phase transition type liquid crystal.

17. The device of claim 15 wherein channels of the transistors comprise a semi-amorphous silicon.

18. The device of claim 15 wherein said electro-optical modulating layer comprises a transparent solid substance and a liquid crystal.

19. The device of claim 15 further comprising an electrode provided on the other one of said substrates.

20. The device of claim 15 wherein said electro-optical modulating layer comprises a color pigment particle and an organic solvent.

* * * * *